United States Patent
Vilain

Patent Number: 5,930,594
Date of Patent: Jul. 27, 1999

[54] METHOD OF MANUFACTURING RIGID FLOATING MICROSTRUCTURE ELEMENTS AND A DEVICE EQUIPPED WITH SUCH ELEMENTS

[75] Inventor: Michel Vilain, St Georges de Commiers, France

[73] Assignee: Commissariat a l'Energie, Paris, France

[21] Appl. No.: 08/676,631

[22] Filed: Jul. 10, 1996

[30] Foreign Application Priority Data

Jul. 13, 1995 [FR] France ................................. 95 08525

[51] Int. Cl.⁶ .................................................. H01L 21/00
[52] U.S. Cl. .................................................. 438/52
[58] Field of Search ................... 438/52, 53, 92, 438/48, 700, 701, 702, 924, 696, 970, 713; 216/2, 56; 250/338.4; 257/494

[56] References Cited

U.S. PATENT DOCUMENTS

| | | |
|---|---|---|
| 4,116,063 | 9/1978 | Leblanc et al. . |
| 4,770,740 | 9/1988 | Tsuzuki et al. . |
| 5,021,663 | 6/1991 | Hornbeck . |
| 5,242,863 | 9/1993 | Xiang-Zheng et al. .................. 438/53 |
| 5,367,167 | 11/1994 | Keenan . |
| 5,369,280 | 11/1994 | Liddiard .............................. 250/370.08 |
| 5,439,552 | 8/1995 | Moret ....................................... 438/52 |
| 5,493,470 | 2/1996 | Zavracky et al. .......................... 438/52 |
| 5,506,175 | 4/1996 | Zhang et al. ............................... 438/52 |
| 5,573,679 | 11/1996 | Mitchell et al. ........................... 438/53 |
| 5,576,250 | 11/1996 | Diem et al. ............................... 438/53 |
| 5,683,546 | 11/1997 | Manka ....................................... 438/53 |
| 5,801,069 | 9/1998 | Harada et al. ............................. 438/52 |
| 5,801,070 | 9/1998 | Zanini-Fisher et al. .................. 438/54 |
| 5,824,565 | 10/1998 | Li et al. .................................... 438/52 |

FOREIGN PATENT DOCUMENTS

WO 94/07115  3/1994  WIPO .

*Primary Examiner*—John F. Niebling
*Assistant Examiner*—S. Mulpuri
*Attorney, Agent, or Firm*—Burns, Doane, Swecker & Mathis LLP

[57] ABSTRACT

A method of manufacturing elements of floating rigid microstructures and a device equipped with such elements.

This method of manufacturing at least one element of a microstructure (104, 116) in a substrate including a stacking of a support layer (100), a layer (102) of sacrificial material and a structure layer (104) comprises the following steps:
  a) etching in the substrate a relief structure (108) with lateral sides (110a, 110b)
  b) formation of a so-called rigidity lining (116) on the lateral sides (110a, 110b),
  c) removal of the sacrificial material from the relief structure (108) in order to release the floating microstructure.

13 Claims, 8 Drawing Sheets

METHOD OF MANUFACTURING RIGID FLOATING MICROSTRUCTURE ELEMENTS AND A DEVICE EQUIPPED WITH SUCH ELEMENTS

DESCRIPTION

1. Technical Field

This invention relates to a method of manufacturing floating microstructure elements and to a device equipped with such elements.

By a floating microstructure one understands a part of a micro-mechanical device which is suspended or free with respect to a substrate.

Moreover, the designation microstructure element refers either to the whole of the microstructure or to only one part of the microstructure such as, for example, the suspension beams which connect it to the substrate.

The invention finds application generally in the field of the manufacture of micro-mechanical devices machined onto substrates, such as micro-motors, micro-machines, sensors, and in particular micro-bolometers.

2. State of the Prior Art

The microstructures are usually produced by the techniques of lithography and etching which allow the shaping of a layer of material or a stacking of layers which form the body of the microstructure.

For information only and put in a simplified way, the manufacture of microstructures and more generally micro-mechanical devices includes, firstly, the production of a stack in which the microstructure is machined. This stack comprises a first support layer onto which a layer of sacrificial material of an organic or mineral nature is deposited or made to grow. Then, one or several layers, generally thin layers, are formed on the sacrificial layer, in which the body of the microstructure is formed.

The shape of the microstructure is defined in these layers by the techniques of lithography and etching already mentioned. Finally the total or partial removal of the sacrificial material allows the total or partial release of the microstructure(s) produced.

According to the design of the lithographic masks used to shape the microstructures, the microstructure elements can be entirely free, such as for example the rotors of micro-motors, or supported in a more or less rigid manner by membranes or restraints provided for this purpose.

A good example of microstructures relevant to this invention is that of micro-bolometers. FIG. 1 illustrates diagrammatically the constituent elements essential for a micro-bolometer. It comprises a central zone 10 fitted with a material sensitive to radiation, capable of generating an electrical signal in response to the detection of radiation. This signal varies with the temperature of the central zone 10, which is itself a function of the absorption of the energy of the illumination that it receives through the use of optical means which are not shown. A more detailed description of the operation and of the structure of the sensitive central zone 10 of a bolometer is given, for example by documents (1) and (2) given as references at the end of this description.

The central zone 10 of the micro-bolometer is connected to rigid mechanical supports 12 by suspension beams 14. The mechanical supports 12 are integral with the support substrate which is not shown in FIG. 1 in the interests of simplicity.

The suspension beams usually have several functions.

A first mechanical function is to maintain the central zone 10 in suspension above the support substrate to avoid all direct mechanical contact between those parts liable to cause a loss of thermal energy.

Added to the role of the beams 14, in mechanically supporting the central zone is that of precisely positioning the central zone 10 with respect to the substrate. In particular, to improve the efficiency of optical absorption of the central zone of the bolometer, it is advisable to control the spacing between this zone and the surface of the underlying support substrate.

Another function of the beams is to make the electrical connections to transmit the electrical signal produced by the active components of the central zone 10 to the reading circuits and the peripheral measuring circuits, formed, for example on the same support substrate (not shown).

Another function or characteristic of the suspension beams is to constitute the thermal insulation between the central zone 10 and the mechanical supports 12 integral with the substrate. In effect, the beams 14 must have a maximum thermal resistance between their ends 16 and 18 in contact respectively with the zone 10 and the supports 12 isothermal with the substrate.

The thermal insulation of the central zone 10 with respect to the supports 12 is, in effect, indispensable to maximise its thermal change due to the effect of illumination and to preventing the thermal energy diffusing to the substrate which constitutes a quasi-infinite thermal mass with respect to the central zone 10.

According to the diagrammatic representation of FIG. 1, the beams 14 have, according to the state of the art, simple rectangular or trapezoidal sections, a thickness e and a length l. A transverse section II—II of the beam 14 is shown on a larger scale in FIG. 2, specifying these dimensions.

The beams which can themselves be considered to be floating microstructure elements comprise one or several stacked layers of material. Their thermal resistance Rth can be expressed by the following equation $Rth = L/(\lambda_{eq} \cdot l \cdot e)$; $\lambda_{eq}$ being the equivalent conductivity of all the various layers with their respective widths and thicknesses along the beams and L is the length of the beams.

In order to increase the thermal resistance of the beams, it is advisable to choose, if possible, materials with a minimum thermal conductivity $\lambda$, to minimise the thickness and the width l, whatever the detailed design of the beam and to maximise the length L.

These mechanical constraints result in a decrease in the robustness of micro-bolometers.

This lack of robustness translates itself essentially into an increased sensitivity to various mechanical stresses to which the structure is liable to be subjected during or after the later stages of its manufacture, and, in particular, after the release of the floating parts by attack on the sacrificial layer. The lack of robustness translates itself also into the structures having less resistance to accelerations and to vibrations.

The robustness defects imply a decrease in the manufacturing output and hence an increased cost of bolometer devices and a limitation to their performance, in terms of signal to noise ratio and in terms of life.

Furthermore, during the manufacture of suspended microstructures, it is often necessary to check with specified precision, the geometric position of the various floating elements, relative to one another. This control assumes knowledge of the conditions of the stresses to which the layers of material forming the microstructure are subjected in the course of the manufacturing operations.

In particular, when a microstructure is machined in a stack formed by several layers of different materials, heating up of the structure risks the production of a "two layer" effect which is liable to cause deformations, lifting or mechanical sticking harmful to the sensitive parts of the microstructure. On the other hand, when the sacrificial layer is removed, the stresses contained in the other layers are released and are then liable to produce the same effects.

In the case where the microstructure is a beam of length L, the resistance to flexing is characterised by the deflection at the beam end under the application of a force F at the free end of the beam, perpendicular to its length, the other end, integral with the substrate, being held rigid. According to whether the force F is applied normal to (perpendicular to) or parallel to the plane of the substrate, the normal deflection ($f_n$) or the parallel deflection ($f_p$) is of the form:

$$f_n = F.L^3/3M.I_n$$

$$f_p = F.L^3/3M.I_p$$

where M is the Young's Modulus for flexing of the material constituting the beam, assumed to be homogeneous for reasons of simplification, and where $I_n$ and $I_p$ are respectively the moments of inertia of the cross section of the beam (for example 14 in FIG. 1) with respect to axes respectively normal and parallel to the plane of the substrate, passing through the geometric axis of the beam.

In the case of a beam of rectangular section of thickness e and of width l, the moments of inertia are expressed by $I_n = l.e^3/12$ and $I_p = l.e^3/12$. The deflections are then of the form:

$$f_n = \frac{4F}{M} \cdot \frac{L^3}{l \cdot e^3}$$

$$\text{and } f_p = \frac{4F}{M} \cdot \frac{L^3}{e \cdot l^3}$$

In the case of a micro-bolometer, one is looking for good beam rigidity and high thermal resistance at the same time.

The resistance to flexing and to rupture of the support beams decreases extremely quickly when one seeks to maximise thermal resistance, that is to say, when one seeks to reduce the width and/or the thickness of the beams and/or to increase their length.

An aim of this invention is to provide a method of manufacturing floating and rigid microstructure elements that does not have the limitations described above.

Another aim is to provide a micro-mechanical device with a floating structure supported by beams, the beams having improved rigidity characteristics.

Still another aim is to provide beams for the suspension of the sensitive zone of a micro-bolometer, which has good rigidity, good resistance to torsion, which are electrically conducting in order to transfer the signals and which have a high thermal resistance Rth.

DESCRIPTION OF THE INVENTION

In order to achieve the aims mentioned above, the invention, more precisely, has the object of a method of manufacturing at least one floating rigid microstructure element machined in a substrate comprising a stack of a support layer, at least one first layer of sacrificial material and at least one first so-called structure layer, characterised in that it comprises the following steps:

a) formation of at least one relief structure with lateral sides by etching the first structure layer and by etching at least a part of the first layer of sacrificial material, according to an etching pattern corresponding to the floating microstructure element, b) formation of a so-called rigidity lining on the lateral sides, c) removal of the sacrificial material from each relief structure in order to release the floating microstructure comprising the structure layer and the rigidity lining.

Hence the microstructure element is made up of the structure layer(s) and the rigidity lining which increases its resistance to flexing and to torsion. The increased rigidity of the microstructure element allows the thickness and/or the width to be reduced, particularly of the structure layer(s) and hence allows an increase in the thermal resistance.

According to an alternative of the method for the manufacture of a microstructure element in a substrate comprising, in addition, a second layer of sacrificial material and a second structure layer stacked in that order between the support layer and the first layer of sacrificial material, the formation of a relief structure with lateral sides comprises, in addition, the etching of the second structure layer and at least a part of the second layer of sacrificial material, and the first structure layer is removed after the formation of the rigidity layer on the lateral sides.

According to another alternative of the method, for the manufacture of a microstructure element in a substrate having alternately two structure layers and two layers of sacrificial material as mentioned above, the method can, in addition, comprise the etching of the second structure layer and at least a part of the second layer of sacrificial material between steps a) and b), in accordance with the pattern corresponding to the positioning of the beams, and then the removal of the first structure layer.

According to the alternative of the method used and according to the structure of the substrate, it is possible to produce different types of rigid microstructure which differ from one another in particular by the arrangement of the rigidity lining with respect to the structure layer.

Similarly, according to whether the etching of the first or of the first and the second layers of sacrificial material is anisotropic or isotropic, it is possible to modify the shape of the rigidity layer and hence to act on its mechanical properties.

Hence this invention provides for the different cases where the etching of the first layer of sacrificial material and the etching of the second layer of sacrificial material are isotropic or anisotropic.

According to one particular aspect of the invention, it is possible to form, prior to step a) of the method, a mask defining the etching pattern. This mask can be removed, for example, before the formation of the rigidity lining. In an advantageous way, it is also possible to only remove the mask after the formation of the rigidity layer. In this latter case, the mask forms part of the relief structure on the sides of which the lining is formed.

This invention also relates to a micro-mechanical device comprising a support substrate, a floating structure separated from the substrate and at least one suspension beam connecting the floating structure to the substrate, characterised in that the beam has side edges having rigidity linings extending along the beam and along planes approximately perpendicular to the beam.

The beam, provided with linings thus has a U or an H shaped section which gives it better rigidity.

According to one particular aspect of the production of such a device, the beam can comprise an alternating stack of at least one layer of electrically conducting material and at least one layer of electrically insulating material.

In one particular application of the invention, the floating structure of the device is the sensitive part of a micro-bolometer.

This floating structure can equally well be equipped on its lateral edges with rigidity linings, for example in the form of a rigidity frame.

Other characteristics and advantages of this invention will better emerge from the description that follows with reference to the appended Figures given purely for information purposes and being non-limitative.

A DETAILED DESCRIPTION OF WAYS OF IMPLEMENTING THE INVENTION

In the description that follows identical reference numbers are given to identical or similar elements or parts of the different Figures.

EXAMPLE 1

A first example of implementing the method of the invention is illustrated by FIGS. 3 to 7. Two very close alternatives of the implementation of the method are explained in the context of Example 1. They are distinguished by the reference numbers terminating by A or by B respectively on the Figures. The numbers that do not terminate in either A or B apply to both alternatives.

Figure 3:
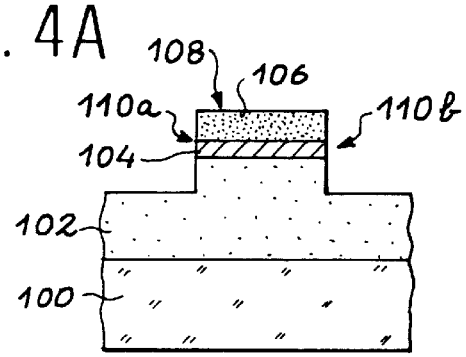

FIG. 3 shows the manufacture of a substrate for the implementation of the method of the invention in a first way. On a support layer 100, a first layer of sacrificial material 102 is deposited then one or several layers of material which form a first layer 104 called a "structure layer" in which subsequently microstructures are machined. Layer 104 may be, for example, a layer of silicon, of silicon oxide, of silicon nitride of metal or an overlaying of layers of materials previously mentioned.

The support layer 100 can also serve as substrate for the manufacture of a microelectronic circuit or of elements of a microelectronic circuit whose function, measurement for example, is associated with the micro-mechanical structure produced in layer 104. This measurement circuit is not shown on the Figures for reasons of clarity.

The sacrificial layer 102 can be made in a material such as, for example, silicon oxide or an organic material such as polyimide.

Figure 2:
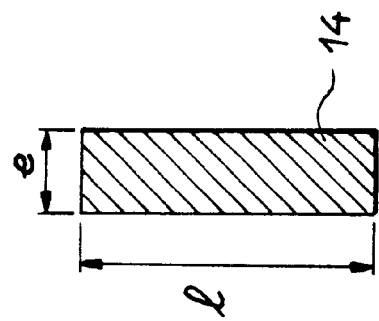
Figure 1:
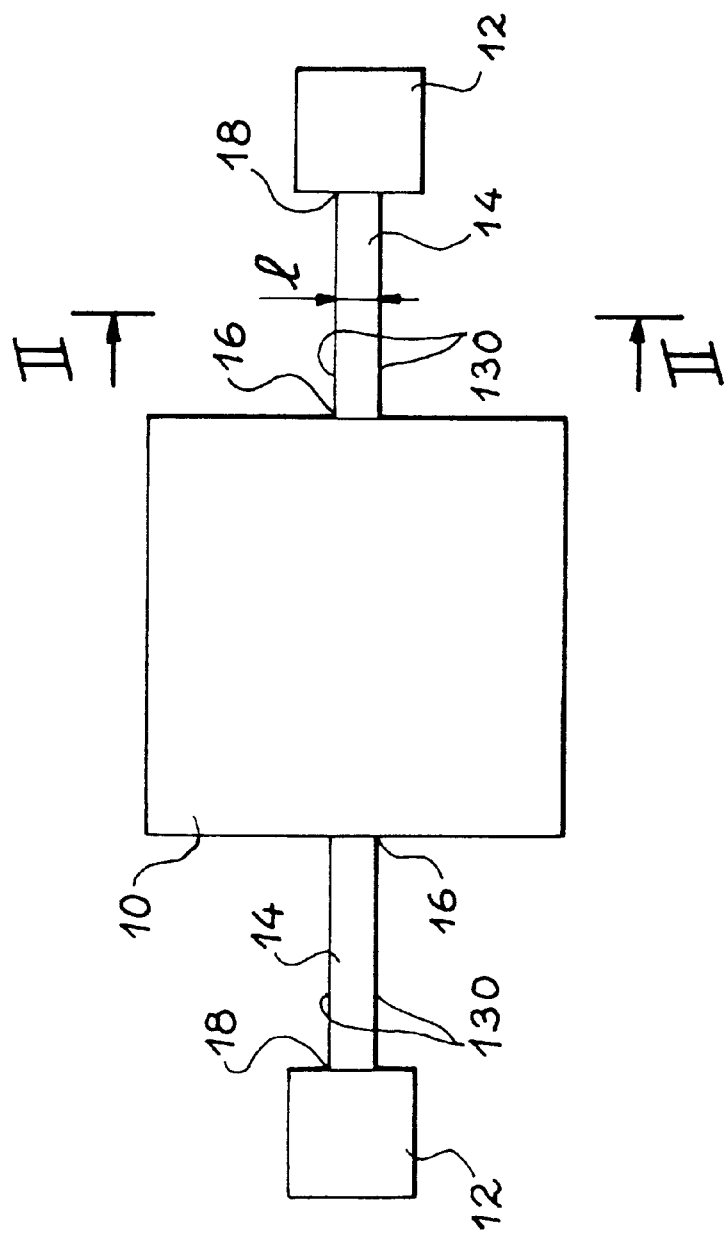
FIG. 1, already described, is a diagrammatic view from above of a micro-bolometer of a known type, FIG. 2, already described, is a cross section view II—II on a larger scale, of a suspension beam of the detection sensitive part of the micro-bolometer of FIG. 1, FIGS. 3 to 4A, 5A, 6A and 7A illustrate, in section, the manufacturing steps of a microstructure element conforming to a first way of implementing the invention.

A following step of the method is the shaping of layer 104 in accordance with an etching pattern. This pattern may, for example, conform to the sensitive part of a micro-bolometer comprising the beams called support arms such as is shown in FIG. 1.

The etching pattern is defined by a resin mask 106 deposited on the layer 104. The parts of the layer 104 which are not protected by the mask 106 are then removed by etching.

Figure 4A:
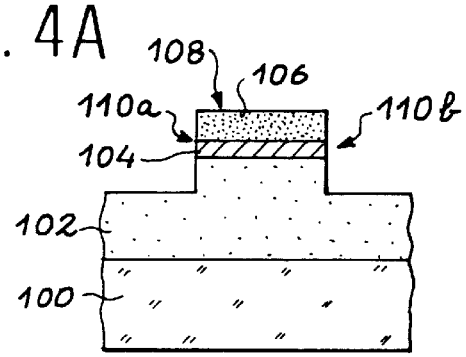
FIGS. 4B, 5B, 6B and 7B illustrate, in section, the manufacturing steps of a microstructure element according to an alternative of the first way of implementing the invention.
Figure 4B:
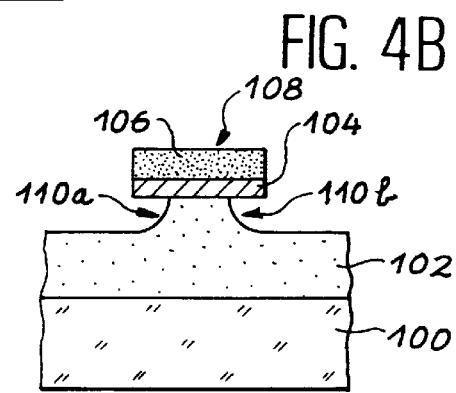

The layer of sacrificial material is also subjected to etching during which those parts not protected by the mask 106 or by the remaining layer 104 are removed in part. This step is illustrated in FIGS. 4A and 4B. Hence a relief structure 108 is obtained in accordance with the etching pattern, that is to say, in accordance with the pattern of the microstructure element that one wishes to produce. The relief structure 108, has one or two lateral sides 110a, 110b.

FIGS. 4A and 4B show the relief structure 108 obtained respectively with an anisotropic etching of the layer of sacrificial material 102 and with an isotropic etching of this layer. In the case of FIG. 4B, the sides 110a and 110b have hollows extending locally under layer 104.

In the case where the layer 102 is silicon oxide, an isotropic etching can be carried out by attack with hydrofluoric acid HF in aqueous phase or in the vapour phase. An anisotropic etching may be by reactive ion etching (RIE) with gaseous fluorocarbons of the type $CHF_3$, $C_2F_6$, for example.

In the case where the sacrificial layer 102 is an organic material, for example a polyimide, an isotropic etching can be carried out with the help of oxygen plasma or by exposure of the layer to ozone. An anisotropic etching may also be by RIE with the gases $O_2$ or a mixture of $O_2+SF_6$. One may note that in the case of an isotropic or anisotropic etching of the layer of sacrificial material under the conditions above, the resin mask 106 is also removed, at least partially.

Figure 5A:
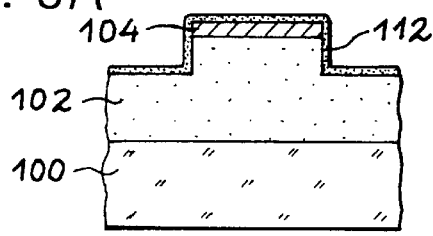
Figure 5B:
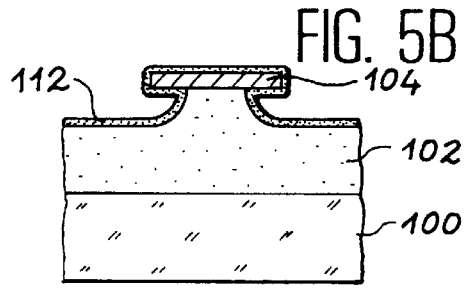

After removal of the mask 106, one forms, as FIGS. 5A and 5B show, one (or several) layer(s) of material 112 which cover(s) notably the sides 110a and 110b of the relief structure. The layer 112 covers all of the free surfaces in the truest and most uniform way possible.

This may be, for example, a layer of silicon, silicon oxide SiO or silicon nitride SiN obtained at low temperature in accordance with a PECVD deposition technique activated by plasma (Plasma Enhanced Chemical Vapour Deposition). A layer of silicon nitride can also be formed by chemical deposition in the vapour phase at low pressure in accordance with a LPCVD technique (Low Pressure Chemical Vapour Deposition). Such a deposition is carried out at a higher temperature, from 600 to 750° C. with mixtures of ammonia and dichlorosilane. The LPCVD technique can also be used to form a layer 112 of silicon oxide. In this case, the deposit can be carried out at temperatures from 850 to 950° C. with mixtures of dichlorosilane and nitrogen monoxide, or at temperatures from 600 to 750° C. with TEOS (tetraethoxysilane) precursors. Furthermore these materials show good covering conformity with the relief structure, particularly when formed by LPCVD.

Layer 112 which covers the relief structure can also be a layer of silicon. The silicon can be formed according to the technique called LPCVD at a temperature from 250 to 500° C. with a source of disilane or at a temperature from 550 to 700° C. with a source of silane. The silicon can be doped or not, for example by the addition or not of diborane or phosphine during its formation. When the silicon is deposited at low temperature, that is to say at a temperature lower than 560° C., layer 112 is amorphous; above 600° C., the layer 112 is polycrystalline.

If one wants to produce a microstructure element with a low thermal conductivity, layer 112 is preferably produced in non-doped amorphous silicon.

Silicon oxide SiO and silicon nitride SiN have good thermal insulation properties. Their conductance is of the order of 2 to 3 W/m.K.

If one wishes to produce a microstructure element having metallic properties, layer 112 is made, for example, in tungsten, in titanium or in titanium nitride by LPCVD deposition for example.

Layer 112 can be made up of a single material or be a combination of several sublayers of different materials, these materials being chosen in relation to the mechanical or electrical properties sought for the microstructure element to be produced. Layer 112 can comprise for example, a dielectric sub-layer of silicon oxide and a sub-layer of silicon.

In this example, layer 112 is made up of a material capable of being deposited on the resin. Its deposition temperature must then be lower than 180° C.

Figure 6A:
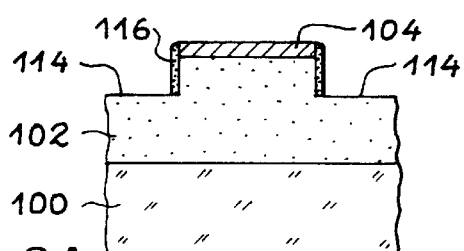
Figure 6B:
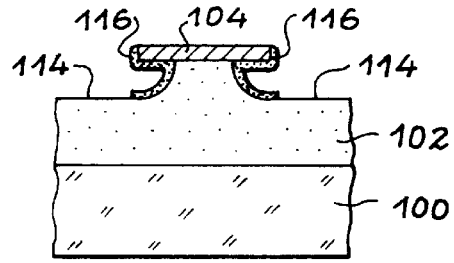

As FIGS. 6A and 6B show, an anisotropic etching without mask allows removal of the part of the layer 112 covering layer 104 and covering the parts 114 of the sacrificial layer on the one hand and the relief structure on the other hand.

During this etching, only the parts of the layer 112 covering the sides 110a and 110b of the relief structure are preserved. These parts are designated in the following as "rigidity linings" and carry reference number 116.

Figure 7A:
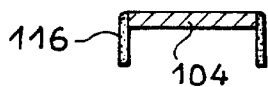
Figure 7A:
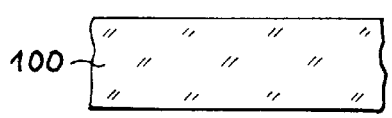
Figure 7B:
Figure 7B:
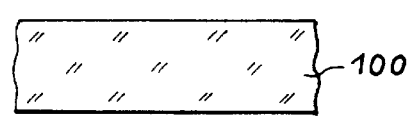

The sacrificial material of layer 102 is then removed as FIGS. 7A and 7B show.

The microstructure element is then released with respect to the substrate 100. It is made up of the layer 104 and the rigidity lining 116.

EXAMPLE 2

An alternative implementation is illustrated by FIGS. 8 to 13.

This implementation of the invention relates to the manufacture of a floating microstructure in a substrate with two structure layers and two layers of sacrificial material.

Figure 8:
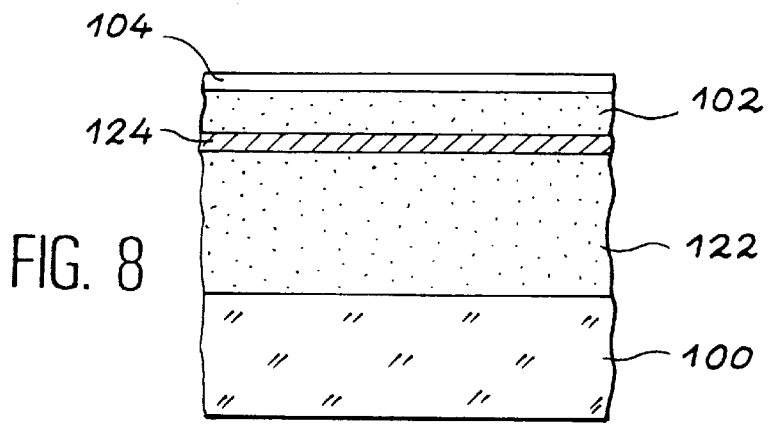
FIGS. 8, 9A, 10A, 11A, 12A and 13A illustrate, in section, the manufacturing steps of a microstructure element conforming to a second way of implementing the invention.

As FIG. 8 shows, a substrate is formed by depositing onto a support layer 100, in succession, a layer of sacrificial material 122, designated as "second layer of sacrificial material" and a layer 124 of structure material designated as "second structure layer", a layer of sacrificial material 102 designated as "first layer of sacrificial material" and a structure layer 104 designated as "first structure layer".

As in the case of Example 1, the sacrificial layers 102, 122 can be made of silicon oxide or of polyimide for example. The structure layers 104, 124 are for example silicon oxide.

After the formation of an etching mask 106 defining the shape of the microstructure to be produced, one carries out, in succession, an anisotropic etching of the first structure layer 104 and the first layer of sacrificial material 102 in the areas not protected by the mask 106.

Figure 9A:
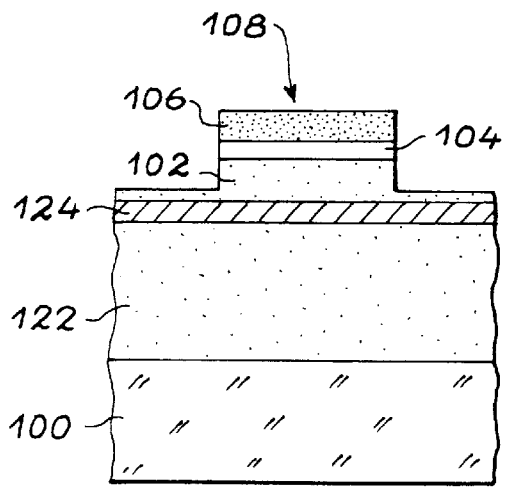
Figure 9B:
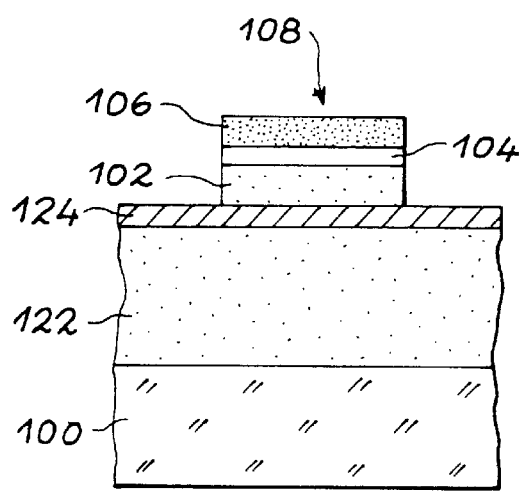
FIGS. 9B, 11B, 12B and 13B illustrate, in section, the manufacturing steps of a microstructure element according to an alternative of the second way of implementing the invention.

One thereby obtains a relief structure 108 conforming to the illustrations in FIGS. 9A and 9B.

In the areas that were not protected, the layer 104 is totally removed and the layer 102 is removed either totally (FIG. 9B) or partially (FIG. 9A).

Figure 10A:
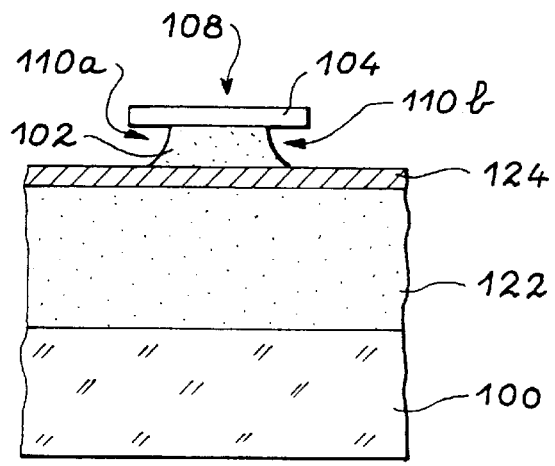
Figure 11A:
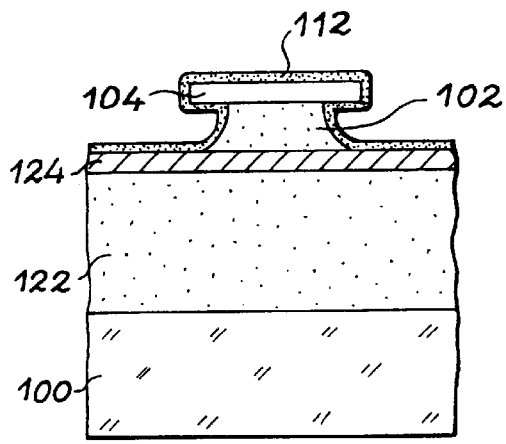
Figure 11B:
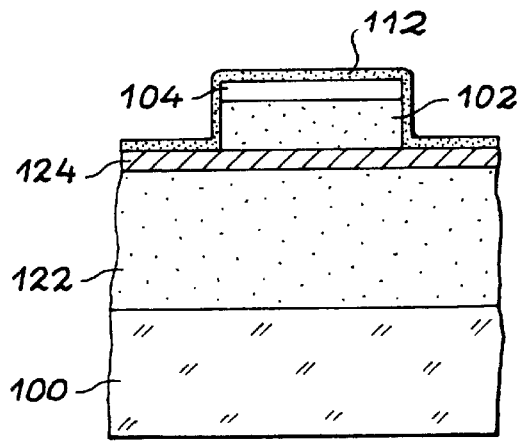
Figure 12:
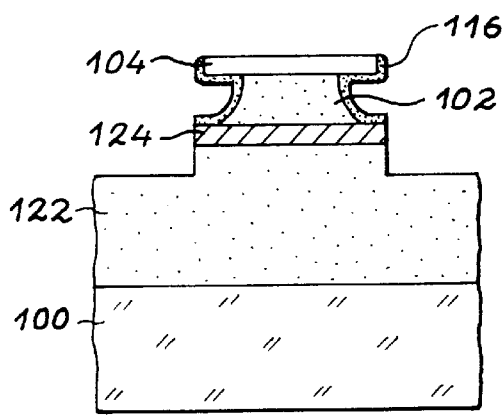
Figure 12:
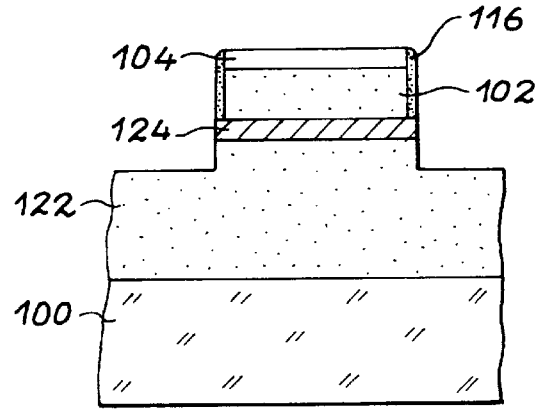
Figure 13:
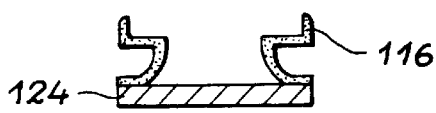
Figure 13:
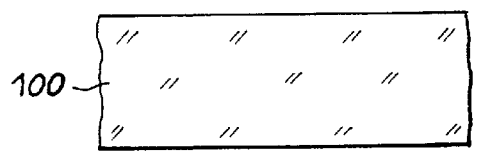
Figure 13:
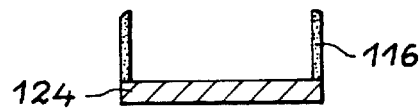
Figure 13:
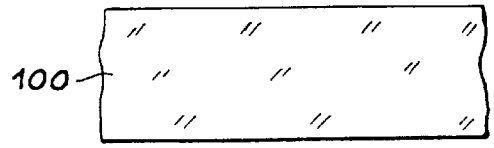

The anisotropic etching of the first sacrificial layer 102 can be completed, as FIG. 10A shows, by an isotropic etching of the layer 102. This has the effect of forming hollows extending along the sides 110a and 110b of the structure 108.

After the removal of the mask 106, as in the case of Example 1, the structures 108 in relief, thus obtained are covered with a layer 112, or a plurality of layers 112. The formation of the layer 112, visible in FIGS. 11A and 11B conforms to the description given for Example 1.

An anisotropic etching without a mask removes layer 112 above the first structure layer 104 and on the parts 114 of the sacrificial layer. The layer 112 is only preserved on the sides 110a and 110b where it forms the rigidity lining 116. As FIGS. 12A and 12B show, the second structure layer 124 is also etched. This etching is not necessarily a selective etching. Hence, as FIGS. 12A and 12B show, layer 122 can also be lightly attacked. During this etching, the first layer 104 serves as an etching mask.

Preferably, an anisotropic etching is carried out which allows the simultaneous shaping of the rigidity linings and the etching of the layer 124. After removal of the first structure layer, the material remaining from the first and second sacrificial layers 102 and 122 is then removed in order to obtain a floating microstructure element with a U section, conforming to the one in FIGS. 13A and 13B. This comprises a part of layer 124, forming, for example, a suspension beam of the sensitive part of a micro-bolometer, and the rigidity linings 116. According to whether an isotropic etching of the first sacrificial layer 102 has been carried out or not, a rigidity structure is obtained with a shaped section (13A) or a straight section (13B).

EXAMPLE 3

Figure 14:
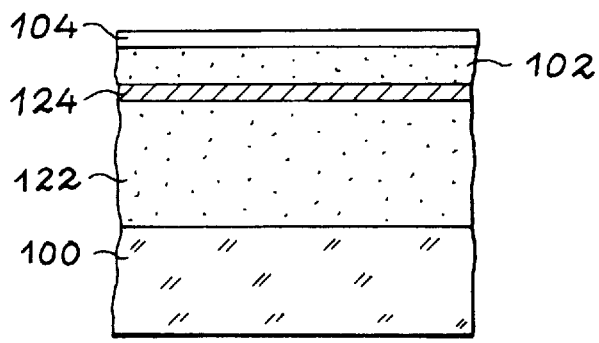
FIGS. 14 to 18 illustrate, in section, the manufacturing steps of a microstructure element according to a third way of implementing the invention.

Another example of implementation of the invention is illustrated by FIGS. 14 to 18. The basic substrate used in this example, is, as FIG. 14 shows, identical to the substrate used in the case of Example 2.

This comprises a support layer 100, a (first) layer of sacrificial material 102, a (first) structure layer 104, a (second) layer of sacrificial material 122 and a (second) structure layer 124.

After the formation of a mask 106 which defines the shape of the microstructure element that one wishes to produce, one or several attacks are carried out so as to etch, outside the region protected by the mask, the first and second structure layers 104, 124, the first layer of sacrificial material 102 and at least a part of the second layer of sacrificial material 122 in a way that creates a step.

Figure 15:
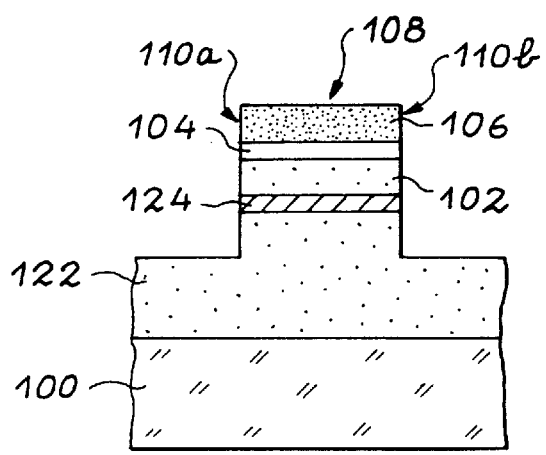

After etching, a relief structure 108 with lateral sides 110a, 110b is obtained such as that shown in FIG. 15.

Figure 16:
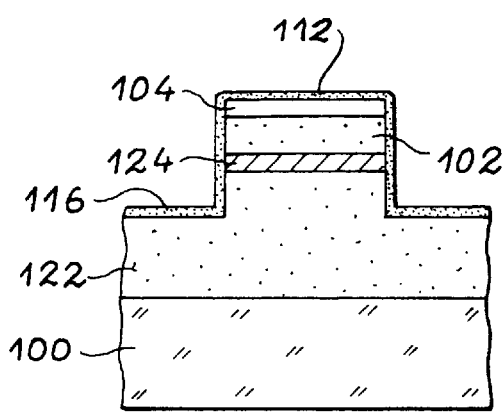
Figure 17:
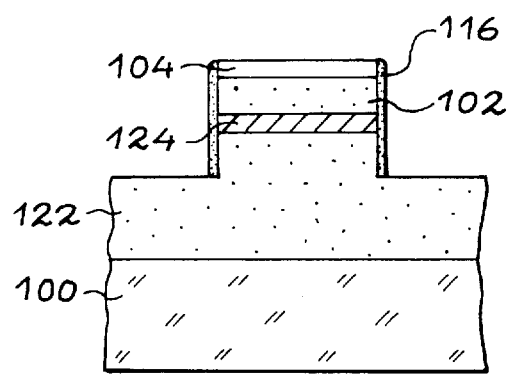
Figure 18:
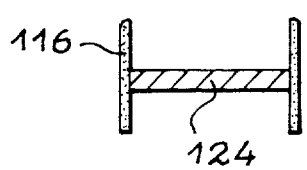
Figure 18:
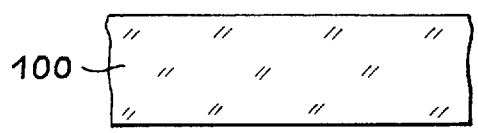

After removal of the mask one (or several) layer(s) 112 is/are formed which cover the relief structure (FIG. 16). As in the case of Examples 1 and 2, the layer 112 is subjected to an anisotropic etching without a mask in order to shape the rigidity linings 116 shown in FIG. 17, on the sides of the relief structure.

In a final step, the first structure layer and the sacrificial material of layers 102 and 122 are removed. A microstructure element with an H section is thus obtained, conforming to FIG. 18.

The central bar of the H section is formed by the second structure layer 124 and the bars perpendicular to the central bar by the rigidity linings 116.

EXAMPLE 4

FIGS. 19 to 23 show another example of implementation of the method starting from a substrate similar to that of FIGS. 8 or 14.

Figure 19:
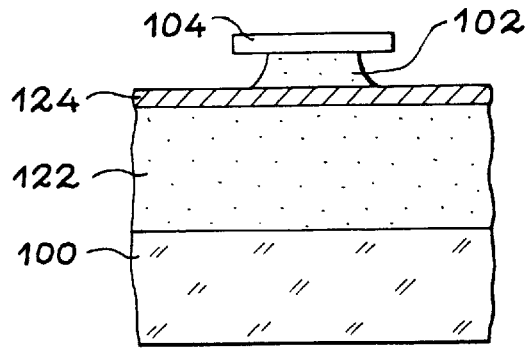
FIGS. 19 to 23 illustrate, in section, the manufacturing steps of a microstructure element according to a fourth way of implementing the invention.

FIG. 19 corresponds to FIG. 10A of Example 2 in which the first structure layer 104 and the first layer of sacrificial material 102 are shaped in accordance with a pattern corresponding to the microstructure element that one wishes to produce. The etching of the layer of sacrificial material is an isotropic etching.

Figure 20:
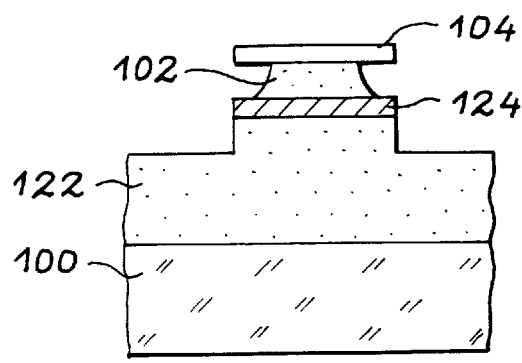
Figure 21:
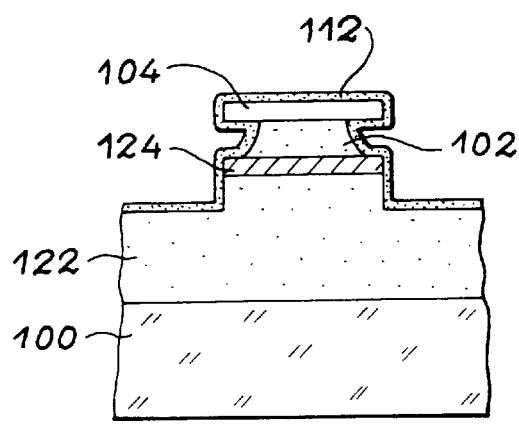
Figure 22:
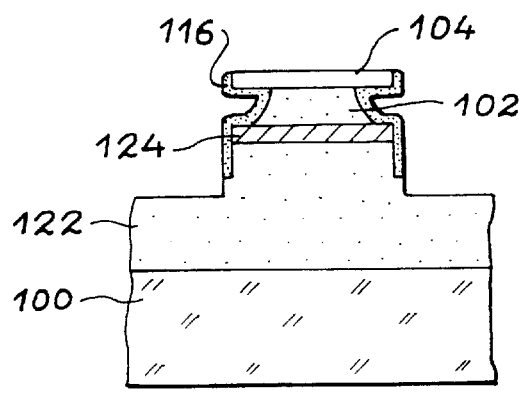

The formation of a relief structure 108 proceeds as is shown in FIG. 20 by the anisotropic etching of the second structure layer 124 and at least a part of the second sacrificial layer 122 in accordance with the etching mask. During this etching, the first structure layer is used as a mask.

As in the case of Example 3, the manufacture of the microstructure element proceeds with the formation of a layer 112 (FIG. 21), the shaping of this layer to obtain the rigidity linings 116 on the sides of the relief structure (FIG. 22) and the removal of the first structure layer and then the remaining sacrificial material from layers 102 and 122.

Figure 23:
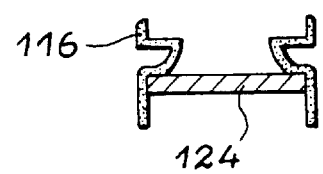
Figure 23:
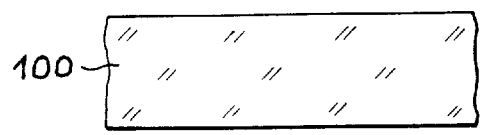

A microstructure element is obtained with a substantially H section, as shown in FIG. 23.

EXAMPLE 5

Figure 24:
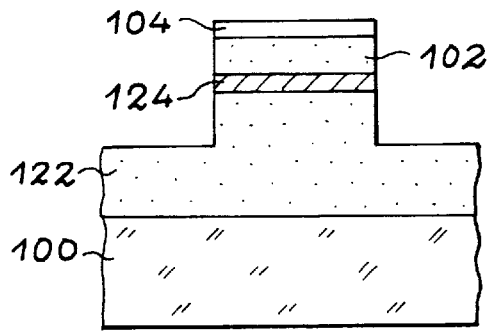
FIGS. 24 to 27 illustrate, in section, the manufacturing steps of a microstructure element according to a fifth way of implementing the invention.

The starting structure for Example 5 is illustrated in FIG. 24. With the exception of the etching mask which is removed, this figure conforms to FIG. 15 already described, and one may refer to Example 3 for the steps to create the relief structure shown in this Figure.

Figure 25:
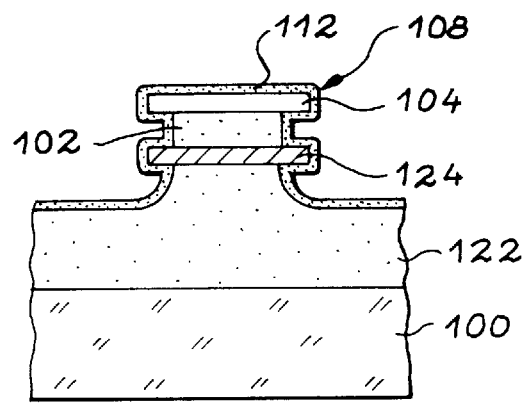

Before the formation of a covering layer 112 on the sides 110a, 110b of the relief structure 108, the sides are, as FIG. 25 shows, subjected to an isotropic etching to cause the parts of the layers of sacrificial material 102 and 122, to be recessed under the structure layers.

Figure 26:
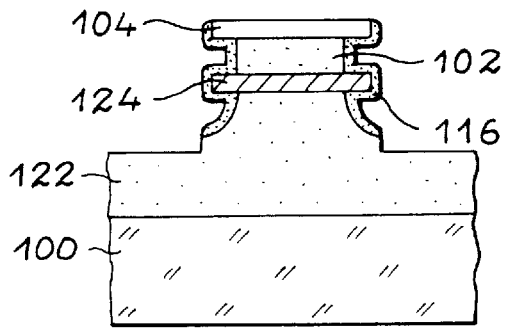
Figure 27:
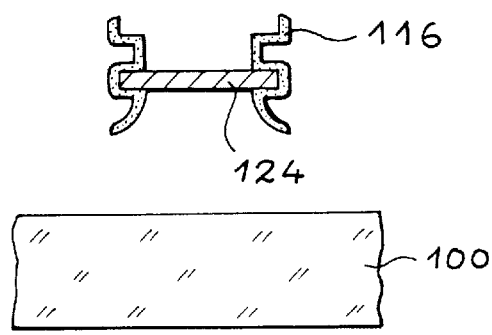
Figure 28:
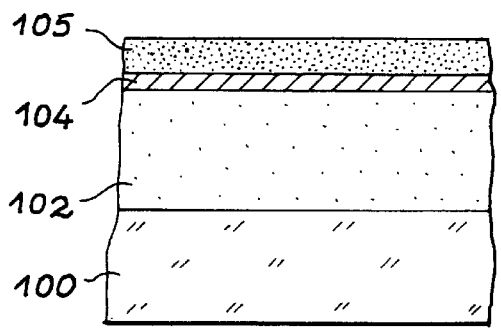
FIGS. 28 to 32 illustrate, in section, the manufacturing steps of a microstructure element according to a sixth way of implementing the invention.

FIGS. 26 and 27 respectively show the anisotropic etching of layer 112 to form the rigidity linings 116 (FIG. 26), and the removal of the first structure layer 104 and of the remaining material from the sacrificial layers 102 and 122 (FIG. 27). A microstructure element is also obtained with a substantially H section but with shaped side bars.

EXAMPLE 6

In Examples 1 to 5, the resin layer forming the mask, does not, strictly speaking, form part of the relief structure as it is used for the creation of the rigidity linings. The mask is removed before the formation of the layer 112.

In an embodiment corresponding to FIGS. 28 to 32, the resin mask is, contrary to this, put to profitable use. As FIG. 19 shows, a substrate is formed by depositing onto a support layer 100, in succession, a layer of sacrificial material 102, a structure layer 104 and a layer of resin 105. For the choice of materials for layers 100, 102 and 104, one may refer to Example 1. The resin layer is used to produce an etching mask already described.

Figure 29:
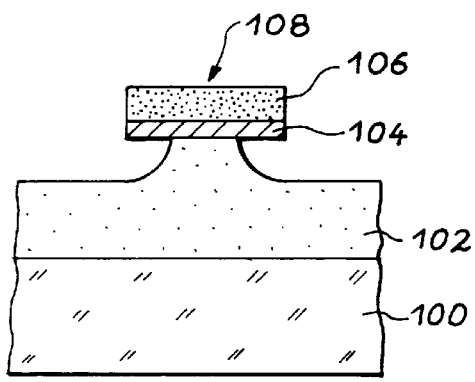

FIG. 29 shows the shaping of a relief structure 108 by etching the structure layer 104 and the partial etching of the layer of sacrificial material 102, in accordance with the pattern of an etching mask 106 produced in the resin layer 105. The etching of layer 102 is of the isotropic type. After this etching, mask 106 is kept; it forms part of the relief structure 108.

Figure 30:
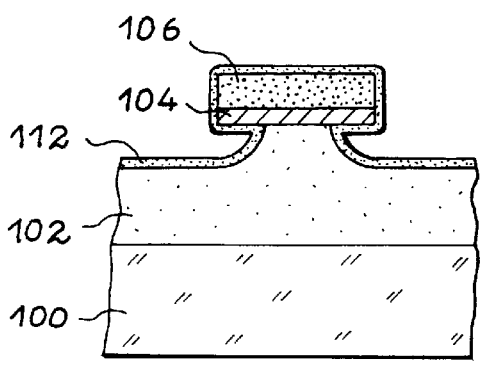
Figure 31:
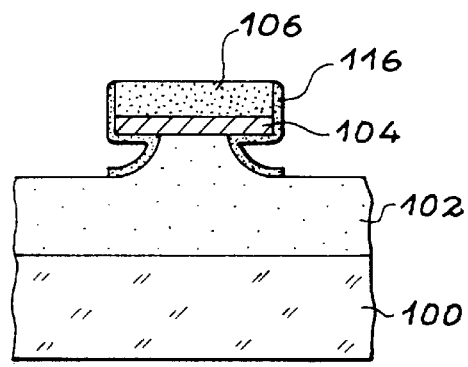

As FIG. 30 shows, a covering layer is formed around the relief structure 108. Then this layer is etched to form the rigidity linings 116 visible in FIG. 31. During this etching, the resin forming the mask 106 is stripped bare.

Figure 32:
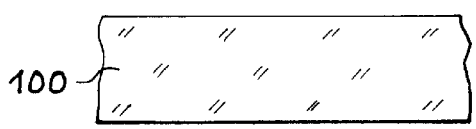

The resin of the mask 106 and the material in the sacrificial layer 102 are finally removed to release a microstructure element shown in FIG. 32.

Whichever example is chosen, the microstructure element can be, for example, a part of a micro-mechanical device such as, for example, a central zone 10 and the suspension beams 14 of a micro-bolometer as shown in FIG. 1.

However, the microstructure element produced according to the invention may only be a part of such a device; for example, only the suspension beams.

The suspension beams produced in accordance with the invention, that is to say with the rigidity linings extending along their lateral edges, have good rigidity and do not become twisted. For information purposes, the lateral edges of the beams are indicated by reference number 130 on FIG. 1. These beams have a U section or an H section with straight or possibly ribbed lateral linings. Different possible sections are shown in FIGS. 7A, 7B, 13A, 13B, 18, 27 and 32.

On the other hand, in the case of micro-bolometers, the central part (see reference number 10 in FIG. 1) is a membrane and it is of interest to provide it also with lateral rigidity linings to form a frame at its periphery. Such a frame enables deformation to be limited and in particular distortion of the central part.

In the particular ways of producing such beams, the structure layer can comprise, for example, one or several layers of an electrically conductive material which plays the role of electrode in order to transmit electrical signals from the central part of a bolometer to peripheral measuring circuits.

In the case where the central part of the beam (structure layer) is made up of two layers of electrically conductive material separated by an insulator, it is possible for electrical leakage to occur between the two conductive materials. These leaks can be avoided by creating a rigidity lining which includes parts made of an insulating material, at least in the areas of contact with the conductive materials.

DOCUMENTS QUOTED (1) U.S. Pat. No. 5,021,663
(2) U.S. Pat. No. 367,167

I claim:

1. A method of manufacturing at least one rigid floating microstructure element machined in a substrate comprising a stacking of a support layer, at least one first sacrificial material layer and at least one first so-called structure layer, characterised in that it comprises the following steps:
   a) formation of at least one relief structure with lateral sides by etching the first structure layer and by etching at least a part of the first layer of sacrificial material, according to an etching pattern corresponding to the floating microstructure element,
   b) formation of a so-called rigidity lining on the lateral sides, c) removal of the sacrificial material from each relief structure in order to release the floating microstructure comprising the structure layer and the rigidity lining.

2. A method of manufacturing a floating microstructure according to claim 1 in a substrate comprising, in addition, a second layer of sacrificial material and a second structure layer stacked in this order between the support layer and the first layer of sacrificial material, in which the formation of a relief structure with lateral sides comprises, in addition, the etching of the second structure layer and at least a part of the second layer of sacrificial material, and in which the first structure layer is removed after the formation of the rigidity lining on the lateral sides.

3. A method of manufacturing a floating microstructure according to claim 1, in a substrate comprising, in addition, a second structure layer and a second layer of sacrificial material stacked in that order between the support layer and the first layer of sacrificial material, the method comprising, in addition, between steps a) and b), the etching of the second structure layer and the etching of at least a part of the second sacrificial layer according to the pattern corresponding to the floating microstructure element and then the removal of the first structure layer.

4. A method according to claim 1, characterised in that the etching of the first layer of sacrificial material is an anisotropic etching.

5. A method according to claim 2, characterised in that the etching of the second layer of sacrificial material is an anisotropic etching.

6. A method according to claim 1, characterised in that the etching of the first layer of sacrificial material is an isotropic etching.

7. A method according to claim 2, characterised in that the etching of the second layer of sacrificial material is an isotropic etching.

8. A method according to claim 1, characterised in that prior to step a), a mask defining the etching pattern is formed on the first structure layer.

9. A method according to claim 8, characterised in that the mask is removed before the formation of the rigidity lining.

10. A method according to claim 8, characterised in that the mask is removed after the formation of the rigidity lining, the mask forming part of the relief structure with the lateral sides.

11. A method according to claim 1, characterised in that the formation of the rigidity lining comprises the deposition of at least one layer of material covering each relief structure, and the anisotropic etching of this layer without masking.

12. A method according to claim 1, characterised in that for the formation of the rigidity lining at least one of the materials among silicon nitride, silicon oxide and silicon or a metal, is chosen.

13. A method for the manufacture of suspension beams for a suspended part of a micro-mechanical device, characterised in that the beams are produced in accordance with the method of claim 1.

* * * * *